US011654511B2

(12) United States Patent
Morikazu (10) Patent No.: US 11,654,511 B2
(45) Date of Patent: May 23, 2023

(54) LASER PROCESSING APPARATUS

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 177 days.

(21) Appl. No.: 16/906,252

(22) Filed: Jun. 19, 2020

(65) Prior Publication Data

US 2020/0406394 A1 Dec. 31, 2020

(30) Foreign Application Priority Data

Jun. 28, 2019 (JP) .............................. JP2019-120713

(51) Int. Cl.
*B23K 26/0622* (2014.01)
*H01L 33/00* (2010.01)

(52) U.S. Cl.
CPC ...... *B23K 26/0622* (2015.10); *H01L 33/0093* (2020.05)

(58) Field of Classification Search
CPC ............ B23K 26/0622; B23K 26/0626; B23K 26/0608; H01L 33/0093
USPC .............. 219/121.6, 121.61, 121.67, 121.72; 438/46
See application file for complete search history.

(56) References Cited

U.S. PATENT DOCUMENTS

| 6,257,224 B1* | 7/2001 | Yoshino ................ H01L 21/304 125/20 |
| 2011/0206072 A1* | 8/2011 | Karavitis ............ H01S 3/10046 372/25 |
| 2012/0241427 A1* | 9/2012 | Maltsev ............. B23K 26/0732 219/121.85 |
| 2013/0017640 A1* | 1/2013 | Morikazu ............... H01L 23/00 438/46 |
| 2015/0273624 A1* | 10/2015 | Yoshida .................... B32B 7/05 428/209 |
| 2016/0243646 A1* | 8/2016 | Kleinert ............. B23K 26/0853 |

FOREIGN PATENT DOCUMENTS

| DE | 102017208953 A1 | 11/2017 |
| DE | 102018216923 A1 | 4/2019 |

(Continued)

OTHER PUBLICATIONS

Translation of German Office Action from counterpart patent application No. DE 10 2020 207 901.3 dated Jul. 28, 2022 (5 pages).

*Primary Examiner* — Tu B Hoang
*Assistant Examiner* — Alba T Rosario-Aponte
(74) *Attorney, Agent, or Firm* — Greer, Burns & Crain, Ltd.

(57) ABSTRACT

A laser processing apparatus includes a chuck table for holding a workpiece, a laser beam applying unit for applying a pulsed laser beam to the workpiece held by the chuck table while positioning spots of the pulsed laser beam on the workpiece, thereby processing the workpiece with the pulsed laser beam, and a control unit for controlling operation of the laser beam applying unit. The laser beam applying unit includes a laser oscillator for oscillating pulsed laser to emit a pulsed laser beam, a decimator for decimating pulses of the pulsed laser beam to adjust a repetitive frequency thereof, a scanner for scanning the spots of the pulsed laser beam over the workpiece at predetermined intervals, and an fθ lens for focusing the pulsed laser beam.

5 Claims, 6 Drawing Sheets

(56) References Cited

FOREIGN PATENT DOCUMENTS

| | | | | |
|---|---|---|---|---|
| DE | 102018220595 | A1 | | 6/2019 |
| JP | 10305420 | A | | 11/1998 |
| JP | 2006088199 | A | * | 4/2006 |
| JP | 2008264805 | A | | 11/2008 |
| JP | 2013021225 | A | | 1/2013 |

* cited by examiner

ADJUSTMENT TABLE
                                                                    ~110

| OPERATION FREQUENCY OF SCANNER : 12.74~25.48Hz | |
|---|---|
| AREA | ADJUSTMENT VALUE |
| 1. RADIUS 50 ~ 25mm | : REPETITIVE FREQUENCY 200kHz<br>  PULSE ENERGY : 10μJ |
| 2. RADIUS 25 ~ 12.5mm | : REPETITIVE FREQUENCY 100kHz<br>  PULSE ENERGY : 10.5μJ |
| 3. RADIUS 12.5 ~ 6.25mm | : REPETITIVE FREQUENCY 50kHz<br>  PULSE ENERGY : 10.8μJ |
| 4. RADIUS 6.25 ~ 3.13mm | : REPETITIVE FREQUENCY 25kHz<br>  PULSE ENERGY : 11μJ |
| 5. RADIUS 3.13 ~ 1.56mm | : REPETITIVE FREQUENCY 12.5kHz<br>  PULSE ENERGY : 11.2μJ |
| 6. RADIUS 1.56 ~ 0.78mm | : REPETITIVE FREQUENCY 6.25kHz<br>  PULSE ENERGY : 11.5μJ |
| 7. RADIUS 0.78 ~ 0.39mm | : REPETITIVE FREQUENCY 3.125kHz<br>  PULSE ENERGY : 11.8μJ |
| 8. RADIUS 0.39 ~ 0.196mm | : REPETITIVE FREQUENCY 1.563kHz<br>  PULSE ENERGY : 12.1μJ |
| 9. RADIUS 0.195 ~ 0.098mm | : REPETITIVE FREQUENCY 0.781kHz<br>  PULSE ENERGY : 12.5μJ |

LASER PROCESSING APPARATUS

BACKGROUND OF THE INVENTION

Field of the Invention

The present invention relates to a laser processing apparatus for positioning the spots of a pulsed laser beam on a workpiece held on a chuck table and applying the pulsed laser beam to the workpiece to process the workpiece.

Description of the Related Art

Light-emitting wafers have a light-emitting layer including an n-type semiconductor layer and a p-type semiconductor layer and formed on the upper surface of an epitaxy substrate such as a sapphire substrate or an SiC substrate with a buffer layer interposed therebetween by epitaxial growth. The light-emitting wafers also have a plurality of devices such as light emitting diodes (LEDs) formed in respective areas that are demarcated in the light-emitting layer by a plurality of intersecting projected dicing lines. The light-emitting wafers are then divided along the projected dicing lines by a laser beam or the like into individual LED chips including the devices respectively (see, for example, Japanese Patent Laid-open No. Hei 10-305420).

There has been proposed a technology in which, in order to increase the luminance of LEDs and also a cooling effect therefor, a relocation substrate such as a molybdenum substrate, a copper substrate, or a silicon substrate is joined to a light-emitting layer of a light-emitting wafer by a bonding agent of indium, palladium, or the like, thereby fabricating a stacked wafer, and thereafter a laser beam is applied from an epitaxy substrate side to a buffer layer to destroy the buffer layer, producing a wafer where the light-emitting layer is relocated to the relocation substrate (see, for example, Japanese Patent Laid-open No. 2013-021225).

In a case where the pulsed laser beam is applied to a circular stacked wafer when it is applied from the epitaxy substrate side to the buffer layer to destroy the buffer layer according to the technology disclosed in Japanese Patent Laid-open No. 2013-021225, it is customary to use a scanner to scan the pulsed laser beam over the circular stacked wafer spirally from an outer circumferential side radially inwardly toward the center of the wafer to destroy the buffer layer, thereby forming a peel-off layer.

SUMMARY OF THE INVENTION

When the pulsed laser beam is scanned over the circular stacked wafer spirally from the outer circumferential side radially inwardly toward the center of the circular stacked wafer, in order to keep the spots of the pulsed laser beam spaced at constant intervals on the wafer, it is necessary to progressively increase the operation frequency of the scanner that scans the pulsed laser beam over the wafer as the pulsed laser beam moves from the outer circumferential side radially inwardly toward the center of the wafer. However, even though the operation frequency of the scanner is varied to keep laser beam spots at constant intervals, the repetitive frequency of the pulsed laser beam may exceed a maximum allowable value for the operation frequency of the scanner, and the actual operation frequency of the scanner may fail to follow an expected operation frequency, possibly disturbing the intervals between the laser beam spots, failing to destroy the buffer layer reliably, or destroying the light-emitting layer instead. Furthermore, in another application where no peel-off layer is formed in the stacked wafer described above and the upper surface of a workpiece is ground, a pulsed laser beam is spirally applied to the upper surface of the workpiece in order to accelerate the grinding process. This application also suffers a problem in that the actual operation frequency of the scanner may fail to follow an expected operation frequency, possibly resulting in uneven laser processing on the upper surface of the workpiece.

It is therefore an object of the present invention to provide a laser processing apparatus for applying a pulsed laser beam to a workpiece to process the workpiece with laser beam spots spaced at proper intervals.

In accordance with an aspect of the present invention, there is provided a laser processing apparatus including a chuck table for holding a workpiece, a laser beam applying unit for applying a pulsed laser beam to the workpiece held by the chuck table while positioning spots of the pulsed laser beam on the workpiece, thereby processing the workpiece with the pulsed laser beam, and a control unit for controlling operation of the laser beam applying unit. In the laser processing apparatus, the laser beam applying unit includes a laser oscillator for oscillating pulsed laser to emit a pulsed laser beam, a decimator for decimating pulses of the pulsed laser beam to adjust a repetitive frequency thereof, a scanner for scanning the spots of the pulsed laser beam over the workpiece at predetermined intervals, and an fθ lens for focusing the pulsed laser beam, and the control unit operates the decimator to keep an operation frequency of the scanner within a predetermined operation frequency range thereof to decimate pulses of the pulsed laser beam emitted from the laser oscillator, thereby adjusting the repetitive frequency of the pulsed laser beam output from the decimator.

Preferably, the control unit controls the scanner to scan the spots of the pulsed laser beam over the workpiece spirally inwardly from an outer circumference thereof and to increase the operation frequency of the scanner as the spots of the pulsed laser beam move inwardly on the workpiece to decrease the radius of a spiral pattern of the spots, and controls the decimator to lower the repetitive frequency of the pulsed laser beam and controls the scanner to lower the operation frequency of the scanner before the operation frequency of the scanner exceeds the predetermined operation frequency range thereof.

Preferably, the control unit includes an adjustment table containing pulse energy levels corresponding respectively to repetitive frequencies adjusted by decimation of pulses from the pulsed laser beam by the decimator and established in the adjustment table, and the decimator includes an acoustooptical device for adjusting the repetitive frequency of the pulsed laser beam emitted from the laser oscillator and adjusting pulse energy indicated to the laser beam applying unit, on the basis of the pulse energy levels corresponding to the repetitive frequencies established in the adjustment table.

Preferably, the workpiece includes a stacked wafer comprising a light-emitting wafer including an epitaxy substrate and a light-emitting layer with a buffer layer interposed therebetween, and a relocation substrate disposed on the light-emitting layer of the light-emitting wafer, the control unit controls the laser beam applying unit to apply the pulsed laser beam while positioning the spots thereof on the buffer layer, thereby destroying the buffer layer and replacing the buffer layer with a peel-off layer, and the epitaxy substrate is peeled off from the light-emitting layer to relocate the light-emitting layer to the relocation substrate.

According to the present invention, even in a case where a pulsed laser beam is applied to a buffer layer in a circular stacked wafer spirally from an outer circumference thereof toward the center thereof, the buffer layer can be uniformly destroyed by spots of the pulsed laser beam scanned at predetermined intervals by a scanner whose operation frequency stays within a predetermined operation frequency range not exceeding an allowable value. The laser processing apparatus is free of such problems that the actual operation frequency of the scanner may fail to follow an expected operation frequency, possibly disturbing the intervals between the laser beam spots, failing to destroy the buffer layer reliably, or destroying the light-emitting layer instead, as the spots of the pulsed laser beam go inwardly toward the center of the stacked wafer. If a pulsed laser beam is applied to an upper surface of a workpiece before the upper surface of the workpiece is to be ground, since the pulsed laser beam is uniformly applied to the upper surface of the workpiece, the grinding process on the upper surface of the workpiece is smoothly accelerated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
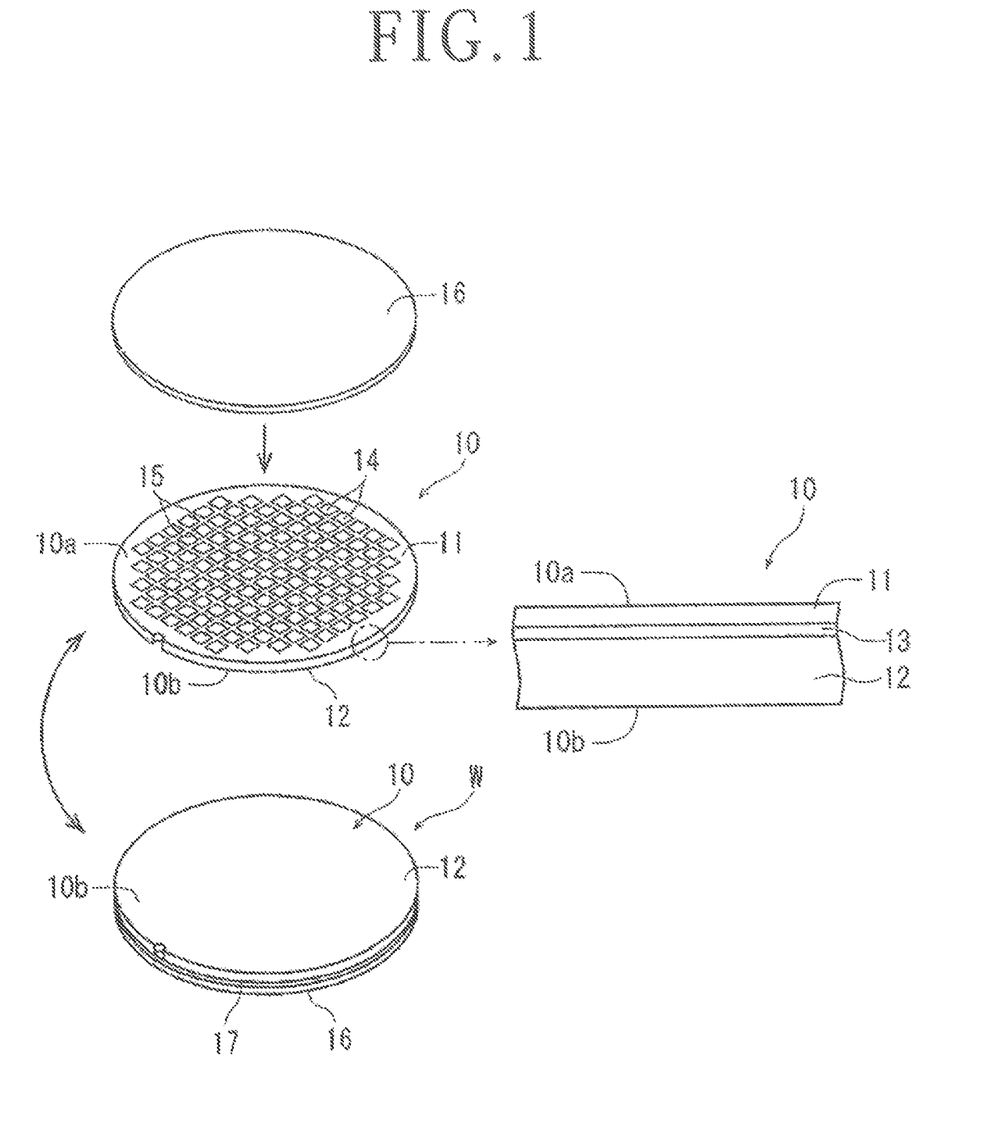
FIG. 1 is an exploded perspective view of a stacked wafer to be processed by a laser processing apparatus according to a preferred embodiment of the present invention.

A laser processing apparatus according to a preferred embodiment of the present invention will be described hereinbelow with reference to the accompanying drawings. FIG. 1 illustrates in exploded perspective a circular workpiece to be processed by the laser processing apparatus according to the present embodiment. In FIG. 1, the circular workpiece is illustrated as a stacked wafer W including a light-emitting wafer 10 and a relocation substrate 16.

As can be understood from an enlarged fragmentary cross section of an encircled portion of the light-emitting wafer 10 illustrated in FIG. 1, the light-emitting wafer 10 includes a sapphire substrate 12 prepared as an epitaxy substrate and a light-emitting layer 11 and a buffer layer 13 that are formed on the surface of the sapphire substrate 12 by epitaxial growth. The light-emitting layer 11 includes an n-type gallium nitride semiconductor layer, a p-type gallium nitride semiconductor layer, and an appropriate conductive pattern, which are not illustrated, and has a plurality of LEDs 14 formed thereon in respective areas demarcated by a grid of projected dicing lines 15. The material of the light-emitting layer 11 is not limited to gallium nitride (GaN) and may be GaP, GaInAs, or the like. The buffer layer 13 is made of the same semiconductor as the light-emitting layer 11. The light-emitting layer 11 provides a face side 10a of the light-emitting wafer 10, and the sapphire substrate 12 provides a reverse side 10b of the light-emitting wafer 10. According to the present embodiment, the light-emitting wafer 10 has a diameter of 100 mm and a thickness of 600 μm. The buffer layer 13 has a thickness of 1 μm, and the light-emitting layer 11 has a thickness of 10 μm.

In order to peel off the light-emitting layer 11 from the sapphire substrate 12 and relocate or transfer the light-emitting layer 11 to the relocation substrate or transfer substrate 16, a relocation substrate joining step is carried out to join the relocation substrate 16 to the face side 10a of the light-emitting wafer 10, as illustrated in FIG. 1. In the relocation substrate joining step, the relocation substrate 16, which is a copper substrate, is joined to the light-emitting layer 11 that provides the face side 10a of the light-emitting wafer 10, by a bonding layer 17 made of a bonding agent of gold tin or the like, for example. Specifically, the bonding agent referred to above is evaporated to form the bonding layer 17 to a thickness of approximately 3 μm on the light-emitting layer 11 of the light-emitting wafer 10 or on the surface of the relocation substrate 16, and the bonding layer 17 and the surface of the relocation substrate 16 or the face side 10a of the light-emitting layer 11 are pressed face to face against each other, thereby joining the light-emitting wafer 10 and the relocation substrate 16 to each other by the bonding layer 17 interposed therebetween to produce a stacked wafer W. The relocation substrate 16 has a diameter of 100 mm as with the light-emitting wafer 10 and has a thickness of 1 mm, for example. The stacked wafer W illustrated below the light-emitting wafer 10 in FIG. 1 depicts the reverse side 10b, i.e., the sapphire substrate 12, facing upwardly and the relocation substrate 16 facing downwardly, with the light-emitting layer 11 and the buffer layer 13 omitted from illustration. The dimensions illustrated in FIG. 1 do not represent actual dimensions.

Figure 2:
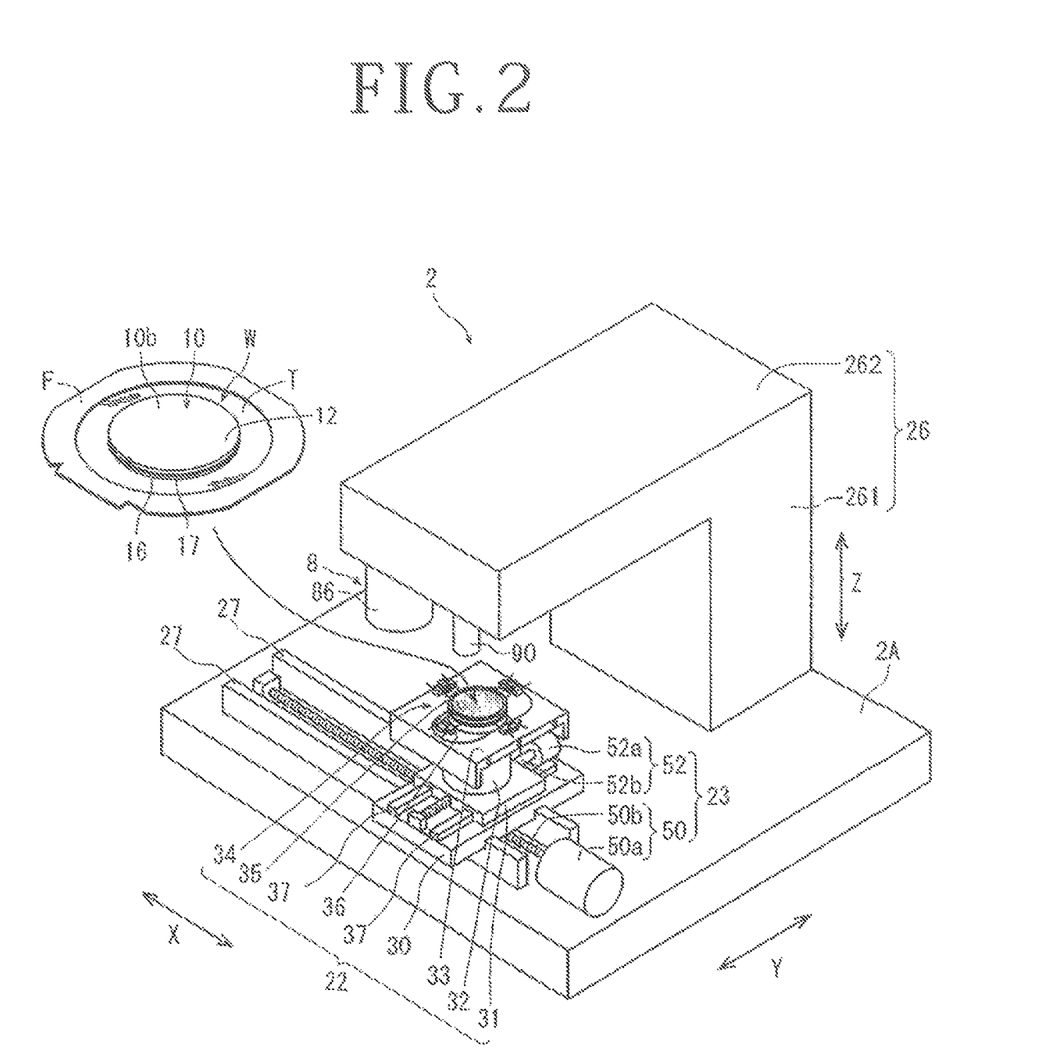
FIG. 2 is a perspective view of the laser processing apparatus in its entirety which processes the stacked wafer illustrated in FIG. 1.

The stacked wafer W thus prepared by joining the light-emitting wafer 10 and the relocation substrate 16 to each other is then introduced into a laser processing apparatus 2 illustrated in FIG. 2. For introducing the stacked wafer W into the laser processing apparatus 2, as illustrated in FIG. 2, the relocation substrate 16 of the stacked wafer W is affixed to the surface of an adhesive tape T mounted on an annular frame F, making the stacked wafer W supported on the annular frame F by the adhesive tape T with the relocation substrate 16 facing downwardly and the sapphire substrate 12 facing upwardly.

After the stacked wafer W has been supported on the annular frame F by the adhesive tape T, the assembly is introduced into the laser processing apparatus 2. The laser processing apparatus 2 applies a pulsed laser beam to the stacked wafer W from the side of the sapphire substrate 12 to destroy the buffer layer 13. A general makeup of the laser processing apparatus 2 will be described below with reference to FIG. 2.

The laser processing apparatus 2 includes a base 2A, a laser beam applying unit 8 disposed on the base 2A for applying a pulsed laser beam to a workpiece, i.e., the stacked wafer W, a holding unit 22 for holding the stacked wafer W, a moving mechanism assembly 23 disposed on the base 2A for moving the laser beam applying unit 8 and the holding unit 22 relatively to each other, and a frame 26 disposed on the base 2A laterally of the moving mechanism assembly 23. The frame 26 includes a vertical wall 261 erected in Z directions indicated by the arrow Z and extending perpendicularly to X directions indicated by the arrow X and Y directions indicated by the arrow Y, and a horizontal wall 262 extending horizontally from an upper end portion of the vertical wall 261.

The horizontal wall 262 of the frame 26 houses therein an optical system, to be described later, of the laser beam applying unit 8. The laser beam applying unit 8 also includes a beam condenser 86 mounted on a lower surface of a distal end portion of the horizontal wall 262. An alignment unit 90 is disposed on a lower surface of the distal end portion of the horizontal wall 262 at a position adjacent to the beam condenser 86 in one of the X directions.

The alignment unit 90 is used to capture an image of the stacked wafer W held on a chuck table 34 of the holding unit 22 and to position the beam condenser 86 and the stacked wafer W in alignment with each other on the basis of the captured image. The alignment unit 90 includes an image capturing device, i.e., a charged couple device (CCD), for capturing an image of the surface of the stacked wafer W by using a visible light beam, infrared radiation applying means for applying an infrared radiation to the stacked wafer W, an optical system for capturing the infrared radiation applied from the infrared radiation applying means, and an image capturing device, i.e., an infrared CCD, for outputting an electric signal representing the infrared radiation captured by the optical system.

As illustrated in FIG. 2, the holding unit 22 includes a rectangular X-direction movable plate 30 movably mounted on the base 2A for movement in the X directions, a rectangular Y-direction movable plate 31 movably mounted on the X-direction movable plate 30 for movement in the Y directions perpendicular to the X directions, a hollow cylindrical support post 32 fixedly mounted on an upper surface of the Y-direction movable plate 31, and a rectangular cover plate 33 fixed to the upper end of the support post 32. The chuck table 34 is disposed on the cover plate 33 and extends upwardly in an oblong hole defined in the cover plate 33. The chuck table 34 holds the circular workpiece and is rotatable about its central axis by unillustrated rotary actuating means housed in the support post 32. The chuck table 34 has an upper surface on which there is disposed a circular suction chuck 35 made of an air-permeable porous material and extending substantially horizontally. The suction chuck 35 is connected to unillustrated suction means through an unillustrated suction channel defined in the support post 32. Four clamps 36 that are spaced at regular intervals are disposed around the suction chuck 35. The clamps 36 grip the annular frame F to securely hold the stacked wafer W on the suction chuck 35.

The moving mechanism assembly 23 includes an X-direction moving mechanism 50 and a Y-direction moving mechanism 52. The X-direction moving mechanism 50 converts rotary motion of an electric motor 50a into linear motion with a ball screw 50b and transmits the linear motion to the X-direction movable plate 30, moving the X-direction movable plate 30 in the X directions along a pair of guide rails 27 on the base 2A. The Y-direction moving mechanism 52 converts rotary motion of an electric motor 52a into linear motion with a ball screw 52b and transmits the linear motion to the Y-direction movable plate 31, moving the Y-direction movable plate 31 in the Y directions along a pair of guide rails 37 on the X-direction movable plate 30. Although not illustrated, position detecting means is disposed on each of the chuck table 34, the X-direction moving mechanism 50, and the Y-direction moving mechanism 52. The position detecting means accurately detects positions of the chuck table 34 in the X directions, the Y directions, and an angular position of the chuck table 34 in circumferential directions. On the basis of the detected positions, the X-direction moving mechanism 50, the Y-direction moving mechanism 52, and the rotary actuating means for the chuck table 34 are actuated to position the chuck table 34 accurately in a desired position at a desired angle.

Figures 3A, 3B:
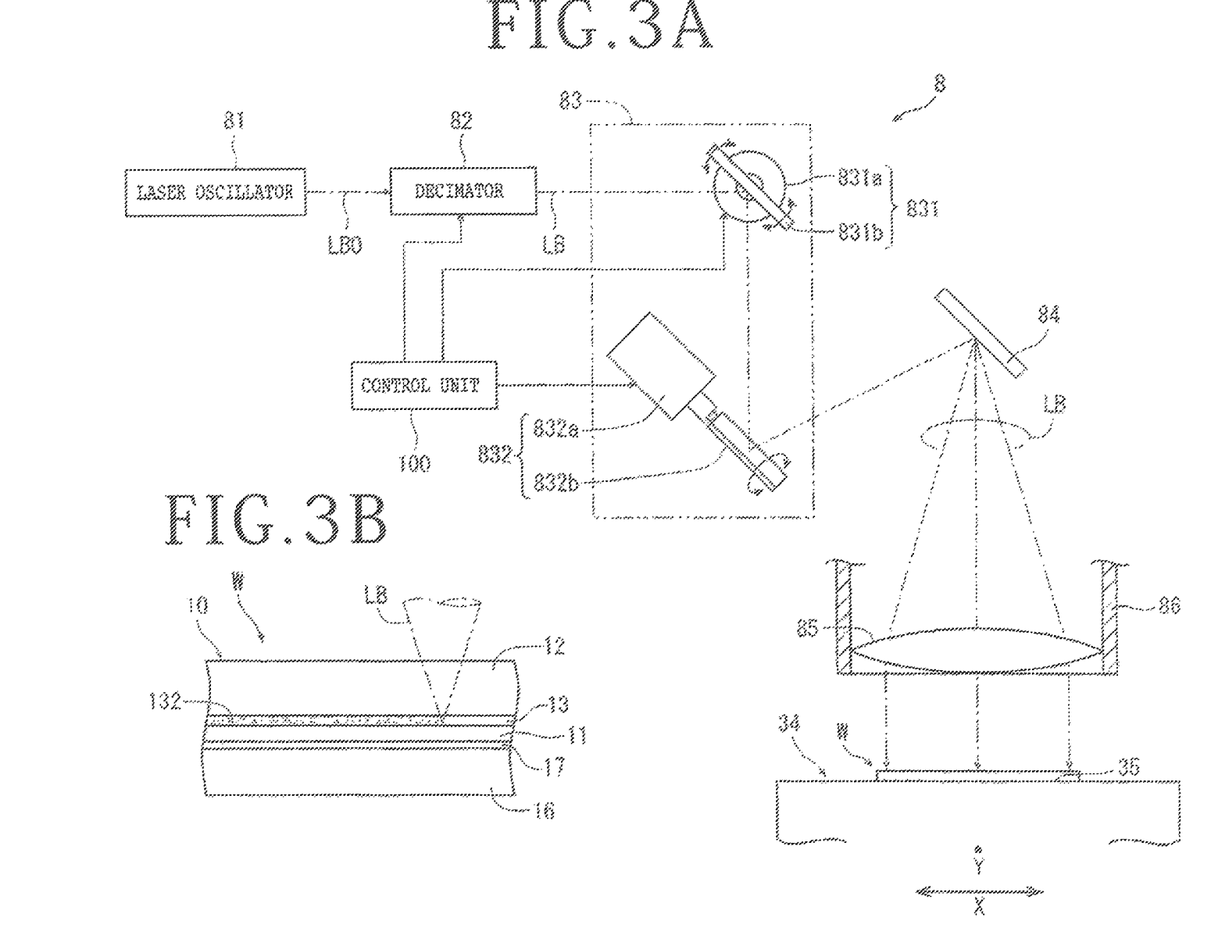
FIG. 3A is a schematic view, partly in block form, of an optical system of a laser beam applying unit incorporated in the laser processing apparatus illustrated in FIG. 2.
FIG. 3B is an enlarged fragmentary cross-sectional view illustrating the manner in which the stacked wafer is processed by the laser processing apparatus.
Figure 4A:
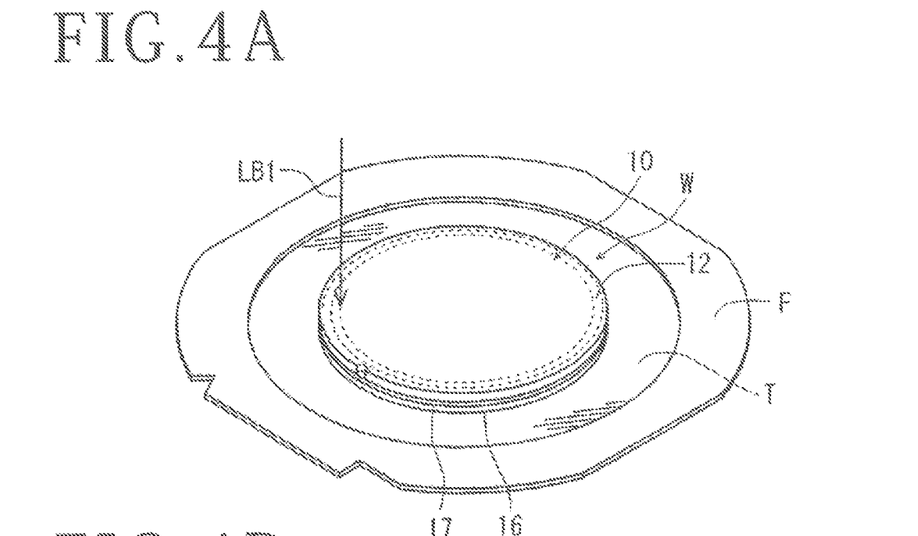
FIGS. 4A and 4B are perspective views illustrating the manner in which a peel-off layer forming step carried is out by the laser processing apparatus illustrated in FIG. 2.
Figure 4B:
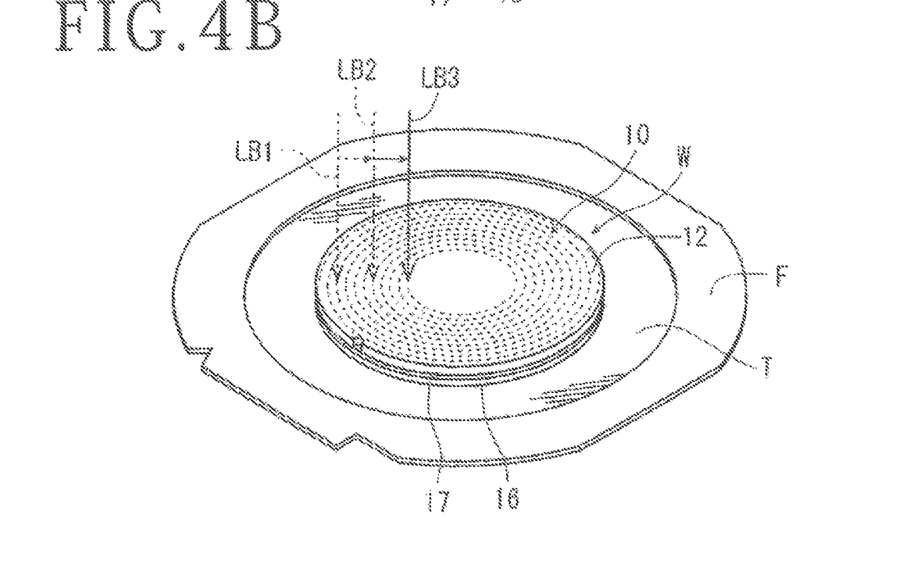

FIG. 3A schematically illustrates, partly in block form, the optical system of the laser beam applying unit 8. As illustrated in FIG. 3, the laser beam applying unit 8 includes a laser oscillator 81 for oscillating pulsed laser and emitting a pulsed laser beam LB0 having a predetermined repetitive frequency, which is of 200 kHz according to the present embodiment, a decimator 82 for decimating laser beam pulses from the pulsed laser beam LB0 emitted from the laser oscillator 81, at a desired ratio, and outputting a pulsed laser beam LB that has been adjusted to a desired repetitive frequency, a scanner 83 for scanning the spots of the pulsed laser beam LB output from the decimator 82 over the upper surface of the chuck table 34 at desired positions in the X and Y directions, a fixed mirror 84 for reflecting the pulsed laser beam LB output from the scanner 83 to thereby cause the pulsed laser beam LB to travel along a changed optical path, a beam condenser 86 having an fθ lens 85 for focusing the pulsed laser beam LB reflected by the fixed mirror 84 and applying the focused pulsed laser beam LB to the chuck table 34, and a control unit 100, such as a processor or computer, for controlling operation of the decimator 82 and the scanner 83. The control unit 100 may also be electrically connected to various actuators including the moving mechanism assembly 23 of the laser processing apparatus 2 for controlling those actuators, in addition to controlling the laser beam applying unit 8. The fθ lens 85, which is positioned below the fixed mirror 84, functions to apply the pulsed laser beam LB dispersedly over the entire surface of the stacked wafer W as the angle of the pulsed laser beam LB scanned by the scanner 83 varies in a predetermined range.

The decimator 82 includes an acoustooptical device, for example, and is electrically connected to the control unit 100. The acoustooptical device may be an acoustic optical modulator (AOM), for example. On the basis of an instruction signal sent from the control unit 100 to the decimator 82, the laser oscillator 81 emits a pulsed laser beam LB0 to the decimator 82. The decimator 82 decimates laser beam pulses from the pulsed laser beam LB0 at a desired ratio, thereby adjusting the repetitive frequency thereof, adjusts the intensity, or pulse energy, of the pulsed laser beam LB to a desired value, based on the instruction signal, and outputs a pulsed laser beam LB with the adjusted repetitive frequency and the adjusted pulse energy.

The scanner 83 includes an X-axis galvanoscanner 831 for scanning the spots of the pulsed laser beam LB over the chuck table 34 in the X directions, i.e., the leftward and rightward directions in FIG. 3A, and a Y-axis galvanoscanner 832 for scanning the spots of the pulsed laser beam LB over the chuck table 34 in the Y directions, i.e., the directions perpendicular to the sheet of FIG. 3A. The X-axis galvanoscanner 831 includes an X-axis galvanomotor 831a and an X-axis scan mirror 831b mounted on the output shaft of the X-axis galvanomotor 831a. The Y-axis galvanoscanner 832 includes a Y-axis galvanomotor 832a and a Y-axis scan mirror 832b mounted on the output shaft of the Y-axis galvanomotor 832a. When the X-axis galvanomotor 831a and the Y-axis galvanomotor 832a are energized to turn their output shafts about their own central axes, the X-axis scan mirror 831b and the Y-axis scan mirror 832b are turned through respective angular ranges to change directions in which the pulsed laser beam LB is reflected by the X-axis scan mirror 831b and the Y-axis scan mirror 832b, making it possible to position the spots of the pulsed laser beam LB in desired positions on the chuck table 34. The control unit 100 has control programs stored therein for controlling the X-axis galvanoscanner 831 and the Y-axis galvanoscanner 832 and can control the X-axis galvanomotor 831a and the Y-axis galvanomotor 832a to operate in respective predetermined operation frequency ranges for moving the position of application of the pulsed laser beam LB over the chuck table 34 at a desired speed. The operation frequency ranges for the X-axis galvanomotor 831a and the Y-axis galvanomotor 832a have a limit value of 40 Hz. The operation frequency ranges also have a maximum allowable value of 30 Hz up to which the X-axis galvanomotor 831a and the Y-axis galvanomotor 832a can operate for precision control over the pulsed laser beam LB.

Furthermore, the laser beam applying unit 8 includes unillustrated focused point position adjusting means. Though specific structural details of the focused point position adjusting means are omitted from illustration, the focused point position adjusting means may include a ball screw extending in the Z directions and threaded through a nut fixed to the beam condenser 86 and an electric motor coupled to an end portion of the ball screw. Rotary motion of the electric motor is converted into linear motion by the ball screw and the nut, and the linear motion is transmitted to the beam condenser 86 to move the beam condenser 86 along an unillustrated guide rail extending in the Z directions, thereby adjusting the position in the Z directions of the focused point of the laser beam LB focused by the beam condenser 86.

The laser processing apparatus 2 according to the present embodiment is of the general arrangement described above. Operation of the laser processing apparatus 2 will be described below. For processing the circular workpiece with the pulsed laser beam LB on the laser processing apparatus 2, the stacked wafer W supported on the annular frame F by the adhesive tape T is prepared as illustrated in FIG. 2. The stacked wafer W is placed on the suction chuck 35 on the chuck table 34 of the holding unit 22, and the unillustrated suction means is actuated to apply suction forces through the suction channel to the suction chuck 35, which holds the stacked wafer W under suction thereon. At the same time, the annular frame F is gripped by the clamps 36 to securely hold the stacked wafer W on the suction chuck 35.

With the stacked wafer W held on the suction chuck 35, the moving mechanism assembly 23 is actuated to move the chuck table 34 in the X and Y directions to position the stacked wafer W on the chuck table 34 directly below the alignment unit 90. When the stacked wafer W has been positioned directly below the alignment unit 90, the alignment unit 90 captures an image of the stacked wafer W. On the basis of the captured image of the stacked wafer W, the moving mechanism assembly 23 moves the chuck table 34 in one of the X directions to position the stacked wafer W below the beam condenser 86. Then, the unillustrated focused point position adjusting means is actuated to move the beam condenser 86 in the Z directions, positioning the focused point of the pulsed laser beam LB on the buffer layer 13 from the side of the sapphire substrate 12 of the stacked wafer W (see FIG. 3B).

After the focused point of the pulsed laser beam LB has been positioned on the buffer layer 13 as described above, a peel-off layer forming step is carried out to form a peel-off layer 132 by destroying the buffer layer 13 as illustrated in FIG. 3B. In the peel-off layer forming step, specifically, the control unit 100 actuates the decimator 82 and the scanner 83 to scan the spots of the pulsed laser beam LB over the stacked wafer W spirally from an outer circumferential side, as indicated by LB1, of the stacked wafer W radially inwardly, as indicated by LB2 and LB3, toward the center of the stacked wafer W, thereby destroying the buffer layer 13.

When the control unit 100 controls the scanner 83 to scan the spots of the pulsed laser beam LB over the stacked wafer W spirally from the outer circumferential side thereof radially inwardly toward the center thereof, the repetitive frequency and pulse energy of the pulsed laser beam LB are adjusted on the basis of an adjustment table 110 (see FIG. 5) stored in the control unit 100. The action of the adjustment table 110 will be described below with reference to FIGS. 4A through 6.

Figure 5:
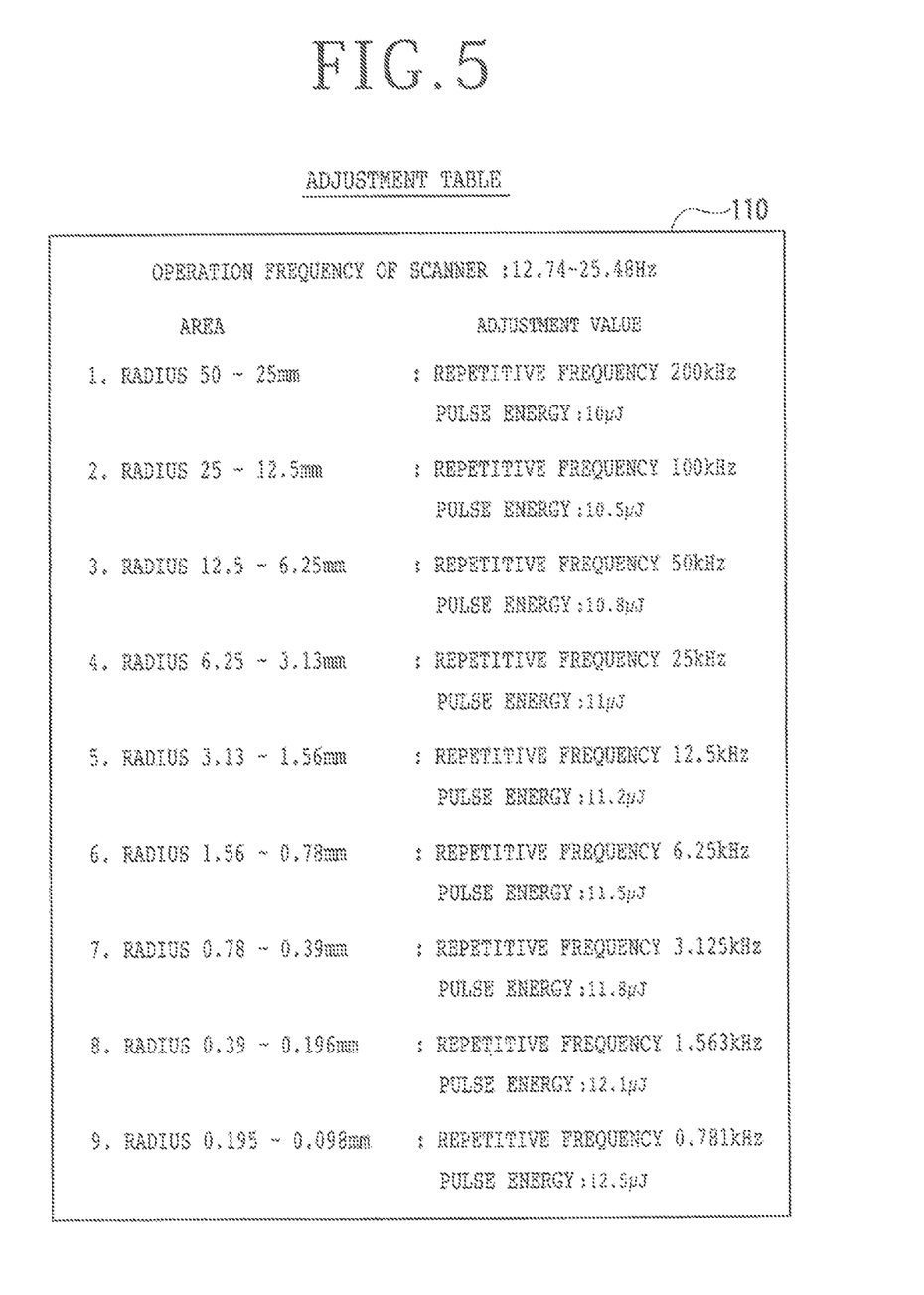
FIG. 5 is a diagram illustrating an adjustment table to be used for controlling the laser beam applying unit illustrated in FIG. 3A.
Figure 6:
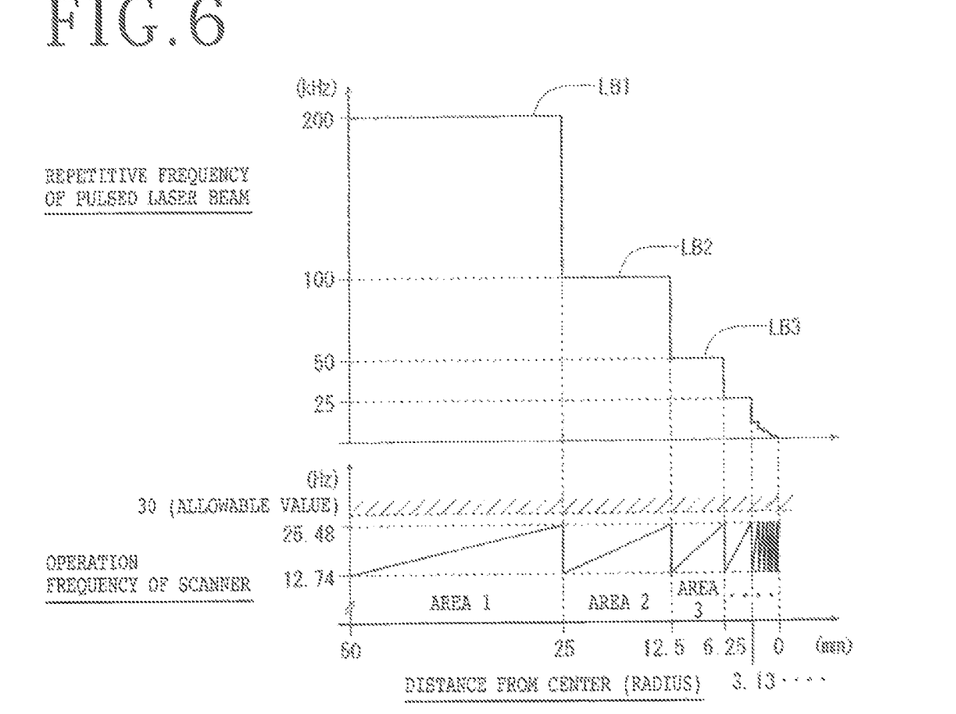
FIG. 6 is a graph illustrating how the repetitive frequency of a pulsed laser beam and the operation frequency of a scanner vary depending on the distance from the center of the stacked wafer in the peel-off layer forming step.

In the adjustment table 110 illustrated in FIG. 5, the entire area of the stacked wafer W from an outermost circumferential position thereof radially inwardly toward the center thereof as viewed in plan is divided into nine areas 1 through 9 depending on the distance from the center, and adjustment values are established for the respective areas. The adjustment values include values of the repetitive frequency adjusted by the decimator 82 and values of the pulse energy indicated to output appropriate pulse energy levels depending on the values of the repetitive frequency. In FIG. 6, the horizontal axis represents the distance, i.e., radius, in millimeters from the center of the stacked wafer W. FIG. 6 illustrates in a lower section how the operation frequency of the scanner 83 varies depending on the distance, or radius, from the center of the stacked wafer W, and also illustrates in an upper section how the repetitive frequency of the pulsed laser beam LB adjusted by the decimator 82 varies depending on the distance, or radius, from the center of the stacked wafer W. As illustrated in FIG. 6, the areas 1 through 9 are defined such that the area 1 from the outermost circumferential position takes up one half of the distance from the outermost circumferential position to the center of the stacked wafer W, the area 2 from the area 1 takes up one half of the remaining distance to the center of the stacked wafer W, the area 3 from the area 2 takes up one half of the remaining distance to the center of the stacked wafer W, and so on. Specifically, the area 1 is defined as ranging from the outermost circumferential position that is spaced 50 mm from the center to a position that is spaced 25 mm from the center, the area 2 as ranging from the position that is spaced 25 mm from the center to a position that is spaced 12.5 mm from the center, and the area 3 as ranging from the position that is spaced 12.5 mm from the center to a position that is spaced 6.25 mm from the center. The remaining areas 4 through 9 are defined as ranging similarly all the way up to the center of the stacked wafer W which is covered by the area 9.

As illustrated in FIGS. 4A through 6, in a case where a pulsed laser beam LB1 starts being applied to the stacked wafer W from the outermost circumferential position thereof, i.e., the position that is 50 mm spaced from the center of the stacked wafer W, the repetitive frequency of the pulsed laser beam LB1 is set to 200 kHz and the pulse energy is set to 10 µJ for the area 1. As illustrated in FIG. 6, the operation frequency of the scanner 83 at the time the X-axis galvanoscanner 831 and the Y-axis galvanoscanner 832 start to operate is set to 12.74 Hz. The operation frequency of the scanner 83 is set to 12.74 Hz for the following reasons: The stacked wafer W whose diameter is 100 mm has an outer circumference of 314 mm. In a case where the laser beam spots are spaced at intervals of 20 µm, the number of laser beam spots applied to the outer circumference is 15,700. Since the pulsed laser beam is applied at a rate of 200,000 pulses/second with the repetitive frequency of 200 kHz, the operation frequency of the scanner 83 is calculated as 200,000/15,700=12.74 per second.

According to the present embodiment, the spots of the pulsed laser beam LB1 are scanned over the stacked wafer W spirally from the outermost circumferential position toward the center of the stacked wafer W, destroying the buffer layer 13 and replacing it with the peel-off layer 132. As illustrated in FIG. 6, as the radius of the spiral pattern of the spots of the pulsed laser beam LB1 becomes progressively smaller and the centers of the spots of the pulsed laser beam LB1 become closer to the center of the stacked wafer W, it is necessary to gradually increase the operation frequency of the scanner 83 from 12.74 Hz in order to keep the laser beam spots spaced at constant intervals. According to the present embodiment, when the centers of the laser beam spots reach the position spaced 25 mm from the center of the stacked wafer W, the operation frequency of the scanner 83 reaches 25.48 Hz. As the maximum allowable value for the operation frequency of the scanner 83 is 30 Hz, as described above, the decimator 82 decimates one half of the pulses of the pulsed laser beam LB1 before the operation frequency of the scanner 83 reaches 30 Hz, i.e., before the spots of the pulsed laser beam LB1 enter the area 2 defined in the adjustment table 110, whereupon a pulsed laser beam LB2 whose repetitive frequency has been adjusted to 100 kHz is applied to the stacked wafer W. Because the repetitive frequency of the pulsed laser beam LB2 is one half, i.e., 100 kHz, of the repetitive frequency of the pulsed laser beam LB0 emitted from the laser oscillator 81, the operation frequency of the scanner 83 does not need to be increased further and is reduced from 25.48 Hz back to 12.74 Hz in order to have the laser beam spots spaced at the same intervals as before.

According to the present embodiment, furthermore, in a case where the spirally scanned spots enter the area 2 and the repetitive frequency of the pulsed laser beam LB2 has been adjusted to 100 kHz, the pulse energy of the pulsed laser beam LB2 indicated by the control unit 100 to the decimator 82 of the laser beam applying unit 8 is adjusted from 10 µJ to 10.5 µJ on the basis of the value set in the adjustment table 110 depending on the repetitive frequency adjusted by the decimator 82.

Even after the laser beam spots have entered the area 2, the spots of the pulsed laser beam LB2 are spirally scanned over the stacked wafer W. As the radius of the spiral pattern is made progressively smaller, the operation frequency of the scanner 83 including the X-axis galvanoscanner 831 and the Y-axis galvanoscanner 832 is gradually increased again from 12.74 Hz, in the same manner as in the area 1. As illustrated in FIG. 6, at the time the laser beam spots reach the position spaced 12.5 mm from the center of the stacked wafer W in the area 2, the operation frequency of the scanner 83 reaches 25.48 Hz close to the maximum allowable value of 30 Hz. According to the present embodiment, the decimator 82 decimates one half of the pulses of the pulsed laser beam LB2 before the operation frequency of the scanner 83 reaches 30 Hz, i.e., before the spots of the pulsed laser beam LB2 enter the area 3 that is spaced less than 12.5 mm from the center of the stacked wafer W, whereupon a pulsed laser beam LB3 whose repetitive frequency has been adjusted to 50 kHz is applied to the stacked wafer W. Since the repetitive frequency of the pulsed laser beam LB3 is one quarter, i.e., 50 kHz, of the repetitive frequency of the pulsed laser beam LB0 emitted from the laser oscillator 81, the operation frequency of the scanner 83 does not need to be increased further and is reduced from 25.48 Hz back to 12.74 Hz again in order to have the laser beam spots spaced at the same intervals as before.

Moreover, in a case where the spirally scanned spots enter the area 3 and the repetitive frequency of the pulsed laser beam LB3 has been adjusted to 50 kHz, the pulse energy of the pulsed laser beam LB3 indicated by the control unit 100 to the decimator 82 of the laser beam applying unit 8 is adjusted from 10.5 µJ to 10.8 µJ on the basis of the value set in the adjustment table 110 depending on the repetitive frequency adjusted by the decimator 82.

As described above, as the spots of the pulsed laser beam LB are continuously spirally scanned over the stacked wafer W toward the center thereof, the laser beam spots enter the area 4 from the area 3 and then go through the areas 5 through 8 before they finally enter the area 9 that covers the center of the stacked wafer W. At this time, the repetitive frequency of the pulsed laser beam LB indicated by the decimator 82 and the pulse energy depending thereon are adjusted on the basis of the adjustment values defined in the adjustment table 110 illustrated in FIG. 5. By thus applying the pulsed laser beam LB to the stacked wafer W from the outer circumference to the center thereof, the laser beam spots are positioned at constant intervals over the entire area of the buffer layer 13 of the stacked wafer W, uniformly forming the peel-off layer 132 that replaces the buffer layer 13.

Laser processing conditions in the peel-off layer forming step described above are established as follows:
Wavelength: 266 nm
Repetitive frequency: 200 to 0.781 kHz
Average output power: 2 W
Pulse energy: 10 to 12.5 µJ
Spot diameter: 50 µm
Spot interval: 20 µm The upper limit, i.e., 25.48 Hz, of the operation frequency range of the scanner 83 defined in the adjustment table 110 is set as the maximum allowable value of the scanner 83 as described above. The lower limit, i.e., 12.74 Hz, of the operation frequency range is of a value determined of its own accord as described above when the pulsed laser beam is applied at the repetitive frequency of 200 kHz before pulse decimation, to scan laser beam spots at the spot interval of 20 µm on the circumference of 314 mm at the outermost circumferential position of the stacked wafer W. The present invention is thus not limited to the illustrated numerical range.

Figure 7:
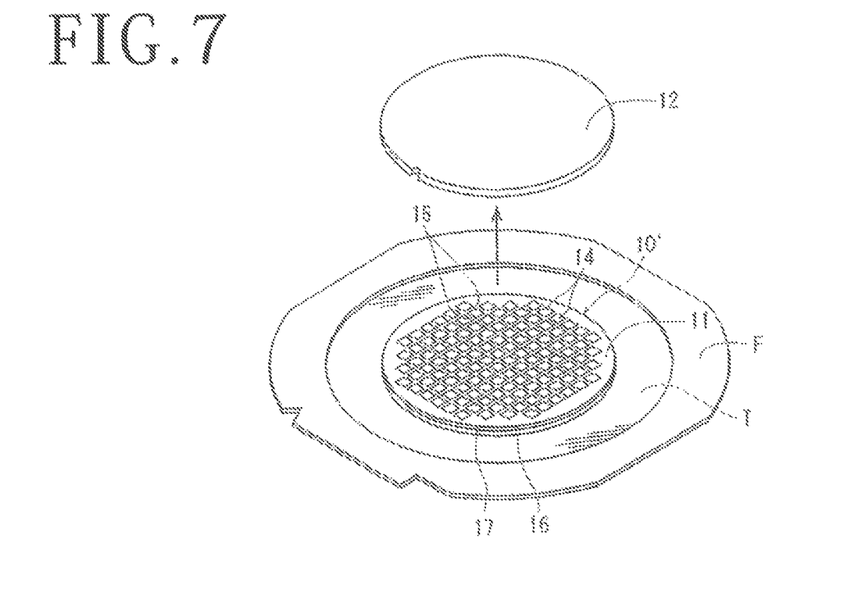
FIG. 7 is a perspective view illustrating the manner in which a sapphire substrate is peeled off from the stacked wafer.

After the peel-off layer 132 has been formed fully replacing the buffer layer 13 in the stacked wafer W as described above, the sapphire substrate 12 is peeled off from the stacked wafer W along the peel-off layer 132 by unillustrated peeling means, as illustrated in FIG. 7. The light-emitting layer 11 is now relocated to the relocation substrate 16, completing a new light-emitting wafer 10'.

According the embodiment described above, in the peel-off layer forming step, the settings of the pulse energy corresponding to the adjusted repetitive frequency are established in the adjustment table 110 and the pulse energy is adjusted on the basis of the settings in the adjustment table 110. The reasons for the settings thus established and a process for establishing the settings of the pulse energy will be described below.

According to the above embodiment, the pulsed laser beam LB0 emitted from the laser oscillator 81 is converted into the pulsed laser beam LB whose repetitive frequency is adjusted by the decimator 82 that decimates pulses at a predetermined ratio from the pulsed laser beam LB0, and the pulsed laser beam LB is applied to the stacked wafer W. The pulse energy of the pulsed laser beam LB0 is adjusted to a desired pulse energy level by an instruction signal sent from the control unit 100 to the decimator 82. In the case where the peel-off layer forming step was carried out with the pulse energy not being adjusted but held to a fixed value of 10 μJ, it was confirmed that the laser beam spots scanned over the stacked wafer W along the buffer layer 13 were spaced at constant intervals, the operation frequency of the scanner 83 did not exceed the maximum allowable value, and the peel-off layer 132 was formed fully replacing the buffer layer 13. However, confirmation of the state of a portion of the peel-off layer 132 that replaced the buffer layer 13 on an outer circumferential side of the stacked wafer W and the state of a portion of the peel-off layer 132 that replaced the buffer layer 13 on an inner circumferential side of the stacked wafer W revealed that the states of those portions of the peel-off layer 132 did not agree with each other.

The above phenomenon may possibly, but not clearly, be caused by the control tracking capability of the decimator 82 and the reduction of the repetitive frequency. In the above peel-off layer forming step, since the repetitive frequency of the pulsed laser beam is lowered in order to keep the laser beam spots where the pulsed laser beam is applied to the stacked wafer W at constant intervals while the operation frequency of the scanner 83 is held below the allowable value, the time intervals between adjacent laser beam spots are increased though the space intervals between the adjacent laser beam spots remain constant. The increased time intervals between adjacent laser beam spots are considered to be responsible for the above phenomenon.

In order to address the above problem by adjusting the pulse energy, the inventors of the present invention prepared dummy wafers such as silicon wafers for use in tests and conducted experimentation according to the following process:

(1) With the pulse energy set to 10 μJ, the repetitive frequency to 200 kHz, and the spot interval to 20 μm, a pulsed laser beam was applied to one of the dummy wafers, then, an image of laser-processed marks left on the dummy wafer was captured by an image capturing unit, and the color of the laser-processed marks was assessed by 256 color shades.

(2) Then, pulsed laser beams having repetitive frequencies varying in eight stages of 100 kHz, 50 kHz, 25 kHz, . . . 0.781 kHz that are the same as those established for the areas 2 through 8 in the adjustment table 110 described above were applied at the spot interval of 20 μm to another one of the dummy wafers. The pulse energy was varied by 0.1 μJ for each of the stages within a predetermined range of 10 to 13 μJ, for example. Then, an image of laser-processed marks left on the dummy wafer was captured by an image capturing unit, and the color of the laser-processed marks was assessed by 256 color shades for each of the stages at each of the pulse energy variations.

(3) The color of the laser-processed marks obtained in (1) was used as a reference color, and the color changes in the respective stages obtained in (2), i.e., at the respective repetitive frequencies, were compared with the reference color to identify laser-processed marks of the colors closest to the reference color at the repetitive frequencies. The pulse energy levels at the time the laser-processed marks of the closest colors were produced were selected as appropriate pulse energy levels at the respective repetitive frequencies, and were established in the adjustment table 110 illustrated in FIG. 5.

By thus establishing the appropriate pulse energy levels corresponding to the respective areas in the adjustment table 110, it was possible to form a more uniform peel-off layer 132 that replaces the buffer layer 13 even if the repetitive frequency of the pulsed laser beam LB and the operation frequency of the scanner 83 were varied as with the above embodiment. The processes (1) through (3) may manually be carried out by the operator though it may alternatively be performed by an automatic process carried out by a computer program including a control program based on a combination of an image processing program for determining colors and other programs.

In the above embodiment, the present invention is applied to an example in which the relocation substrate 16 is joined to the light-emitting wafer 10, the pulsed laser beam is applied to the stacked wafer W while the focused point is positioned on the buffer layer 13, the buffer layer 13 is destroyed and replaced with the peel-off layer 132, and the sapphire substrate 12 is peeled off from the stacked wafer W along the peel-off layer 132, producing the new light-emitting wafer 10' with the relocated light-emitting layer 11. However, the present invention is not limited to the illustrated embodiment and is also applicable to a preprocessing process, prior to a process of grinding a workpiece such as a silicon wafer, for example, in which a laser beam is applied in a spiral pattern to an upper surface of the workpiece in order to accelerate the grinding process.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table for holding a workpiece, the workpiece including a light-emitting layer, a substrate and a buffer layer between the light-emitting layer and the substrate;
a laser beam applying unit for applying a pulsed laser beam to the workpiece held by the chuck table while positioning spots of the pulsed laser beam on the workpiece, thereby processing the workpiece with the pulsed laser beam; and
a control unit for controlling operation of the laser beam applying unit;
wherein the laser beam applying unit includes:
a laser oscillator for oscillating pulsed laser to emit the pulsed laser beam,
a decimator for decimating pulses of the pulsed laser beam to adjust a repetitive frequency of the pulsed laser beam,
a scanner for scanning the spots of the pulsed laser beam over the workpiece at predetermined intervals, said scanner including an X-axis scanner configured for scanning the spots of the pulsed laser beam over the workpiece in a X-direction, said X-axis scanner including an X-axis motor and an X-axis scan mirror mounted on an output shaft of said X-axis motor, a Y-axis scanner configured for scanning the spots of the pulsed laser beam over the workpiece in a Y-direction, said Y-axis scanner including a Y-axis motor and a Y-axis scan mirror mounted on an output shaft of said Y-axis motor, wherein output shafts of said X-axis motor and said Y-axis motor are configured to rotate said X-axis scan mirror and said Y-axis scan mirror; and an fθ lens for focusing the pulsed laser beam at the buffer layer between the light-emitting layer and the substrate of the workpiece, and wherein the control unit operates the decimator to keep an operation frequency of the scanner within a predetermined operation frequency range to decimate pulses of the pulsed laser beam emitted from the laser oscillator, thereby adjusting the repetitive frequency of the pulsed laser beam output from the decimator, wherein the control unit controls the scanner to scan the spots of the pulsed laser beam over the workpiece spirally in a spiral pattern inwardly from an outer circumference toward a center of the workpiece so that a radius of the spiral pattern progressively decreases as centers of the spots move toward the center of the workpiece, and wherein a plurality of radial areas are defined between the outer circumference toward the center of the workpiece and the control unit decreases the repetitive frequency of the pulsed laser beam and increases the pulse energy of the scanner as the spots of the pulsed beam move into each radial area from the outer circumference toward the center of the workpiece and the operation frequency of the scanner increases in each of the plurality of radial areas.

2. The laser processing apparatus according to claim 1, wherein the control unit controls the decimator to lower the repetitive frequency of the pulsed laser beam and controls the scanner to lower the operation frequency of the scanner before the operation frequency of the scanner exceeds the predetermined operation frequency range.

3. The laser processing apparatus according to claim 1, wherein the control unit includes an adjustment table containing pulse energy levels corresponding respectively to repetitive frequencies adjusted by decimation of pulses from the pulsed laser beam by the decimator and established in the adjustment table, and the decimator includes an acoustooptical device for adjusting the repetitive frequency of the pulsed laser beam emitted from the laser oscillator and adjusting pulse energy indicated to the laser beam applying unit, on the basis of the pulse energy levels corresponding to the repetitive frequencies established in the adjustment table.

4. The laser processing apparatus according to claim 1, wherein the light-emitting wafer includes an epitaxy substrate and the workpiece further a relocation substrate disposed on the light-emitting layer of the light-emitting wafer, the control unit controls the laser beam applying unit to apply the pulsed laser beam while positioning the spots of the pulsed laser beam on the buffer layer, thereby destroying the buffer layer and replacing the buffer layer with a peel-off layer, and the epitaxy substrate is peeled off from the light-emitting layer to relocate the light-emitting layer to the relocation substrate.

5. The laser processing apparatus according to claim 1, wherein a first radial area of the radial areas is one half of the distance between the outer circumference and the center of the workpiece and a second radial area of the radial areas is one half of the distance between the first radial area and the center of the workpiece, and each subsequent radial area is one half the distance between the prior radial area to the center of the workpiece.

* * * * *